(12) United States Patent
Grinchuk et al.

(10) Patent No.: US 6,536,027 B1
(45) Date of Patent: Mar. 18, 2003

(54) CELL PIN EXTENSIONS FOR INTEGRATED CIRCUITS

(75) Inventors: Mikhail I. Grinchuk, Mountain View, CA (US); Alexander E. Andreev, San Jose, CA (US); Ranko Scepanovic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 212 days.

(21) Appl. No.: 09/735,837

(22) Filed: Dec. 13, 2000

(51) Int. Cl.[7] .............................................. G06F 17/50
(52) U.S. Cl. ............................. 716/12; 716/13; 716/14
(58) Field of Search .................................... 716/12–14

(56) References Cited

U.S. PATENT DOCUMENTS

| | | | | |
|---|---|---|---|---|
| 4,580,228 A | * | 4/1986 | Noto .............................. 716/9 |
| 4,615,011 A | * | 9/1986 | Linsker ........................ 716/13 |
| 4,752,887 A | * | 6/1988 | Kuwahara ..................... 716/15 |
| 5,303,161 A | * | 4/1994 | Burns et al. ................... 716/9 |
| 5,399,517 A | * | 3/1995 | Ashtaputre et al. ........... 437/51 |
| 5,764,533 A | * | 6/1998 | deDood .......................... 716/8 |
| 5,856,927 A | * | 1/1999 | Greidinger et al. ........... 716/12 |
| 6,240,541 B1 | * | 5/2001 | Yasuda et al. .................. 716/6 |
| 6,323,559 B1 | * | 11/2001 | Chan et al. .................. 257/778 |

OTHER PUBLICATIONS

M.H. Arnold et al., An Interactive Maze Router with Hints, 1988 ACM/IEEE Design Automation Conference, pp. 672–676, Jun. 1988.*

* cited by examiner

Primary Examiner—Matthew Smith
Assistant Examiner—A. M. Thompson
(74) Attorney, Agent, or Firm—Westman, Champlin & Kelly

(57) ABSTRACT

A metal wire for a feature of a cell is extended using a grid based on a metal layer of the cell. Each grid element is assigned an "F" designator representing the metal wire being extended, an "E" designator representing blockages to extension of the metal wire, such as metal wires of other features, or a "U" designator representing grid elements that are neither F-designated, nor E-designated grid elements. U-designated grid elements that are neighbors to E-designated grid elements are identified. A minimum length path is defined through the U-designated grid elements that are not neighbors to E-designated grid elements between the cell boundary and a F-designated grid element.

20 Claims, 7 Drawing Sheets

```
72
9876543210988888888890122222222222222222222223456789012345 67
76543210987666666666678900000000000000000000001234567890123 45
54321098765444444445678888888888888888888888890123456789012 3
32109876543222222223456666666666666666666666666789012345678901
10987654321FFFFFFFF12344444444444444444444456789012345 6789
10987654321FFFFFFFFF1222222222222222222222223456789012345 67
10987654321FFFFFFFFFFFFFFFFFFFFFFFFFFFFFFFF123456789012345
10987654321FFFFFFFFFFFFFFFFFFFFFFFFFFFFFFF1234567890123 45
10987654321FFFFFFFF1222222222222222222221F1234567890123 45
10987654321FFFFFFFFF12344444444444444444321F1234567890123 45
321NNNNNNNNNNNNNNNNNNNNNNNNNNNNNNNNNNNN44321F1234567890123 45
54NNNNNNNNNNNNNNNNNNNNNNNNNNNNNNNNNNNNN4321F1234567890123 45
7NNNNNNNNNNNNNNNNNNNNNNNNNNNNNNNNNNNNNNN321F1234567890123 45
NNNNNNNNNNNNNNNNNNNNNNNNNNNNNNNNNNNNNNNN21F1234567890123 45
NNNNNNNNNNNNNNNNNNNNNNNNNNNNNNNNNNNNNNNN21F1234567890123 45
NNNNNNNNNNNNNNNNNNNNNNNNNNNNNNNNNNNNNNNN21F1234567890123 45
NNNNNNNNNNNNNNNNNNNNNNNNNNNNNNNNNNNNNNNN21F1234567890123 45
NNNNNNNNNNNNNNNNNNNNNNNNNNNNNNNNNNNNNNNN21F1234567890123 45
NNNNNNNNNNNNNNNNNNNNNNNNNNNNNNNNNNNNNNNN21F1234567890123 45
NNNNNNNNNNNNNNNNNNNNNNNNNNNNNNNNNNNNNNNN21F1234567890123 45
NNNNNNNNNNNNNNNEEEEEEEEEEEEEEEENNNNNNNNNNNNFFFFF1234567890123
NNNNNNNNNNNNNNEEEEEEEEENNNNNNNNNNNNNNNN1NNFFFFF1234567890123
NNNNNNNNNNNNNNEEEEEEEENNNNNNNNNNNNNNNNNNNNFFFFF1234567890123
NNNNNNNNNNNNNNNNNNNNNNNNNNNNNNNNNNNNNNNN2222234567890123 45
NNNNNNNNNNNNNNNNNNNNNNNNNNNNNNNNNNNNNNNN4444567890123 4567
NNNNNNNNNNNNNNNNNNNNNNNNNNNNNNNNNNNNNNNN66667890123456789
NNNNNNNNNNNNNNNNNNNNNNNNNNNNNNNNNNNNNNNN8888890123456789 01
NNNNNNNNNNNNNNNNNNNNNNNNNNNNNNNNNNNNNNNN00001234567890123
NNNNNNNNNNNNNNNNNNNNNNNNNNNNNNNNNNNNNNNN2222345678901234 5
.NNNNNNNNNNNNNNNNNNNNNNNNNNNNNNNNNNNNNNN5444456789012345 67
..NNNNNNNNNNNNNNNNNNNNNNNNNNNNNNNNNNNNNN8766666789012345 6789
...NNNNNNNNNNNNNNNNNNNNNNNNNNNNNNNNNNNNN10988889012345678901
....NNNNNNNNNNNNNNNNNNNNNNNNNNNNNNNNNNNNN876543210000012345678901 23
......NNNNNNNNNNNNNNNNNNNNNNNNNNNNNNNNNN109876543222223456789012345

```
AAAAAAAAAAAAAAAAAAAAAAAAAAAAAAAAAAAAAAAAAAAAAAAAAAAAAAAAAAAAAAAA
AAAAAAAAAAAAAAAAAAAAAAAAAAAAAAAAAAAAAAAAAAAAAAAAAAAAAAAAAAAAAAAA
AAAAAAAAAAAAAAAAAAAAAAAAAAAAAAAAAAAAAAAAAAAAAAAAAAAAAAAAAAAAAAAA
AAAAAAAAAAAAAAAAAAAAAAAAAAAAAAAAAAAAAAAAAAAAAAAAAAAAAAAAAAAAAAAA
AAAAAAAAAAFFFFFFFFFFAAAAAAAAAAAAAAAAAAAAAAAAAAAAAAAAAAAAAAAAAAAA
AAAAAAAAAAFFFFFFFFFFFFFFFFFFFFFFFFFFFFFAAAAAAAAAAAAAAAAAAAAAAAAA
AAAAAAAAAAFFFFFFFFFFFFFFFFFFFFFFFFFFFFFFFFFFAAAAAAAAAAAAAAAAAAAA
AAAAAAAAAAFFFFFFFFFFFFFFFFFFFFFFFFFFFFFFFFFFFFAAAAAAAAAAAAAAAAAA
AAAAAAAAAAFFFFFFFFFFAAAAAAAAAAAAAAAAAAAAFAAAAAAAAAAAAAAAAAAAAAAA
AAAAAAAAAAFFFFFFFFFFAAAAAAAAAAAAAAAAAAAFAAAAAAAAAAAAAAAAAAAAAAAA
AANNNNNNNNNNNNNNNNNNNNNNNNNNNNNNNNNNNNNNAAAAFAAAAAAAAAAAAAAAAAAA
ANNNNNNNNNNNNNNNNNNNNNNNNNNNNNNNNNNNNNNNAAAAFAAAAAAAAAAAAAAAAAAA
ANNNNNNNNNNNNNNNNNNNNNNNNNNNNNNNNNNNNNNNNAAAFAAAAAAAAAAAAAAAAAAA
NNNNNNNNNNNNNNNNNNNNNNNNNNNNNNNNNNNNNNNNNAAFAAAAAAAAAAAAAAAAAAAA
NNNNNNNNNNNNNNNNNNNNNNNNNNNNNNNNNNNNNNNNNAAFAAAAAAAAAAAAAAAAAAAA
NNNNNNNNNNNNNNNNNNNNNNNNNNNNNNNNNNNNNNNNNAAFAAAAAAAAAAAAAAAAAAAA
NNNNNNNNNNNNNNNNNNNNNNNNNNNNNNNNNNNNNNNNNAAFAAAAAAAAAAAAAAAAAAAA
NNNNNNNNNNNNNNNNNNNNNNNNNNNNNNNNNNNNNNNNNNAFAAAAAAAAAAAAAAAAAAAA
NNNNNNNNNNNNNNNNNNNNNNNNNNNNNNNNNNNNNNNNNNAFAAAAAAAAAAAAAAAAAAAA
NNNNNNNNNNNNNNNNNNNNNNNNNNNNNNNNNNNNNNNNNNAFAAAAAAAAAAAAAAAAAAAA
NNNNNNNNNNNNNEEEEEEEEEEEEEEEENNNNNNNNNNNNNFFFFAAAAAAAAAAAAAAAAAA
NNNNNNNNNNNNNEEEEEEEEEEEEEENNNNNNNNNNNNNNNFFFFAAAAAAAAAAAAAAAAAA
NNNNNNNNNNNNNEEEEEEEEEEEEENNNNNNNNNNNNNNNNFFFFAAAAAAAAAAAAAAAAAA
NNNNNNNNNNNNNNNNNNNNNNNNNNNNNNNNNNNNNNNNNAAAAAAAAAAAAAAAAAAAAAAA
NNNNNNNNNNNNNNNNNNNNNNNNNNNNNNNNNNNNNNNNNAAAAAAAAAAAAAAAAAAAAAAA
NNNNNNNNNNNNNNNNNNNNNNNNNNNNNNNNNNNNNNNNNAAAAAAAAAAAAAAAAAAAAAAA
NNNNNNNNNNNNNNNNNNNNNNNNNNNNNNNNNNNNNNNNNAAAAAAAAAAAAAAAAAAAAAAA
.NNNNNNNNNNNNNNNNNNNNNNNNNNNNNNNNNNNNNNNNAAAAAAAAAAAAAAAAAAAAAAA
.NNNNNNNNNNNNNNNNNNNNNNNNNNNNNNNNNNNNNNNNAAAAAAAAAAAAAAAAAAAAAAA
..NNNNNNNNNNNNNNNNNNNNNNNNNNNNNNNNNNNNNNAAAAAAAAAAAAAAAAAAAAAAAA
....NNNNNNNNNNNNNNNNNNNNNNNNNNNNNNNNNNAAAAAAAAAAAAAAAAAAAAAAAAAA
.....NNNNNNNNNNNNNNNNNNNNNNNNNNNNNNNNAAAAAAAAAAAAAAAAAAAAAAAAAAA
```

FIG._11

```
                72
9876543210988888888890122222222222222222222345678901234567
76543210987666666666789000000000000000000001234567890012345
5432109876544444444456788888888888888888890123456789012 3
321098765432222222223456666666666666666666678901234567890 1
10987654321FFFFFFFFFF12344444444444444444456789012345678 9
10987654321FFFFFFFFFF12222222222222222223456789012345 67
10987654321FFFFFFFFFFFFFFFFFFFFFFFFFFFFFFFF123456789012345
10987654321FFFFFFFFFFFFFFFFFFFFFFFFFFFFFFFFFF123456789012345
10987654321FFFFFFFFFF122222222222222222221F123456789012345
10987654321FFFFFFFFFF12344444444444444444321F123456789012345
321NNNNNNNNNNNNNNNNNNNNNNNNNNNNNNNNNNN44321F123456789012345
54NNNNNNNNNNNNNNNNNNNNNNNNNNNNNNNNNNNNNN4321F123456789012345
7NNNNNNNNNNNNNNNNNNNNNNNNNNNNNNNNNNNNNNNN321F123456789012345
NNNNNNNNNNNNNNNNNNNNNNNNNNNNNNNNNNNNNNNNNN21F123456789012345
NNNNNNNNNNNNNNNNNNNNNNNNNNNNNNNNNNNNNNNNNN21F123456789012345
NNNNNNNNNNNNNNNNNNNNNNNNNNNNNNNNNNNNNNNNNN21F123456789012345
NNNNNNNNNNNNNNNNNNNNNNNNNNNNNNNNNNNNNNNNNN21F123456789012345
NNNNNNNNNNNNNNNNNNNNNNNNNNNNNNNNNNNNNNNNNN21F123456789012345
NNNNNNNNNNNNNNNNNNNNNNNNNNNNNNNNNNNNNNNNNN21F123456789012345
NNNNNNNNNNNNNEEEEEEEEEEEEEEEENNNNNNNNNNNNNFFFFF1234567890123
NNNNNNNNNNNNNEEEEEEEEEEEEEENNNNNNNNNNNNNNNNFFFFF1234567890123
NNNNNNNNNNNNNEEEEEEEEEEEENNNNNNNNNNNNNNNNNFFFFF1234567890123
NNNNNNNNNNNNNNNNNNNNNNNNNNNNNNNNNNNNNNNNNN2222345678901 2345
NNNNNNNNNNNNNNNNNNNNNNNNNNNNNNNNNNNNNNNNNN44445678901234567
NNNNNNNNNNNNNNNNNNNNNNNNNNNNNNNNNNNNNNNNNN66667890123456789
NNNNNNNNNNNNNNNNNNNNNNNNNNNNNNNNNNNNNNNNNN88889012345678901
NNNNNNNNNNNNNNNNNNNNNNNNNNNNNNNNNNNNNNNNNN00001234567890123
NNNNNNNNNNNNNNNNNNNNNNNNNNNNNNNNNNNNNNNNNN2222345678901 2345
.NNNNNNNNNNNNNNNNNNNNNNNNNNNNNNNNNNNNNNNNN54445678901234567
66 ..NNNNNNNNNNNNNNNNNNNNNNNNNNNNNNNNNNNNNNNN876667890123456789
  ...NNNNNNNNNNNNNNNNNNNNNNNNNNNNNNNNNNNNNNN109888890123456789 01
  ....NNNNNNNNNNNNNNNNNNNNNNNNNNNNNNNNNNNNNN876543210000012345678 90123
  ......NNNNNNNNNNNNNNNNNNNNNNNNNNNNNNNNNN1098765432222234567890 12345
```

CELL PIN EXTENSIONS FOR INTEGRATED CIRCUITS

CROSS-REFERENCE TO RELATED APPLICATIONS

This application is related to application Ser. No. 09/679,313 for "Flexible Search Engine Having Sorted Binary Search Tree For Perfect Match" and to application Ser. No. 09/679,209 for "Fast Flexible Search Engine For Longest Prefix Match", both filed Oct. 4, 2000 by Alexander E. Andreev and Ranko Scepanovic and both assigned to the same assignee as the present invention.

BACKGROUND OF THE INVENTION

This invention relates to integrated circuit (IC) chips, and particularly to facilitation of global routing within IC chips by the inclusion of extra conductor paths or wires to library cells.

IC chips are often based on a collection of cells selected from a library. The cells are laid out and interconnected in an optimal fashion by a router to electrically connect portions of one cell to portions of another cell. Usually cell connection is accomplished on a metal wiring layer. However, if the connection pins of a cell are not easily accessible, difficulty arises in connecting the cell to the wiring layer, and hence to other cells of the chip. While connections can be planned during the initial design phase of the chip, re-working a chip design often results in changes in pin connections and locations, leading to difficulties in pin connections. To solve this problem, it is common to lay out new conductive paths over the metal layer and add conductive vias between the paths. Often new conductive paths are routed between existing paths, leading to increased congestion of the conductive paths and longer conductive runs. The existing conductive paths often require the vias be placed in inconvenient locations, adding to the length of the conductive path.

The present invention is directed to a technique of fabricating additional conductive paths or wires to library cells, presenting the ability to access cell pins at arbitrary coordinates along the path length. Additionally, vias between paths may be placed in more arbitrary locations.

SUMMARY OF THE INVENTION

According to the present invention, a metal wire for a feature of a cell is extended using a grid based on a metal layer of the cell. Each grid element is assigned one of three designators. An "F" designator is assigned to grid elements representing the metal wire being extended. An "E" designator is assigned to grid elements representing blockages to extension of the metal wire, such as metal wires of other features and internal metal wires interconnecting features within the cell. A "U" designator is assigned to grid elements that are neither F-designated, nor E-designated grid elements. U-designated grid elements that are neighbors to E-designated grid elements are identified. A path of minimum width is defined through the U-designated grid elements that are not neighbors to E-designated grid elements between the cell boundary and a F-designated grid element.

In one form of the invention, strings of F-designated grid elements and strings of E-designated grid elements are identified in rows and columns of grid elements. W−1 of the F- and E-designators are changed to U-designations, where W is the minimal width of the wire, to locate grid elements that define the wire.

In another form of the invention, U-designated grid elements that are neighbors to E-designated grid elements are identified by calculating a difference between x coordinates and between the y coordinates of the U-designated grid element and the E-designated grid element. A distance is calculated which is a hypotenuse of a right triangle whose sides are based on the differences between the x and y coordinates. If at least one of the calculation results for a U-designated grid element are smaller than a predetermined value, that U-designated grid element is identified as a neighbor of the E-designated grid element.

In another form of the invention, the path is defined by identifying U-designated grid elements available for a path between the cell boundary and an F-designated grid element that are not neighbors of an E-designated grid element. A minimum path is identified through the available grid elements.

Another form of the invention concerns identification of possible vias to the metal layer through multiple layers of the cell.

In one embodiment, the invention is carried out in a computer under the control of program code that is included in a computer program embedded on a computer readable medium.

DETAILED DESCRIPTION OF THE PREFERRED EMBODIMENTS

Figure 1:
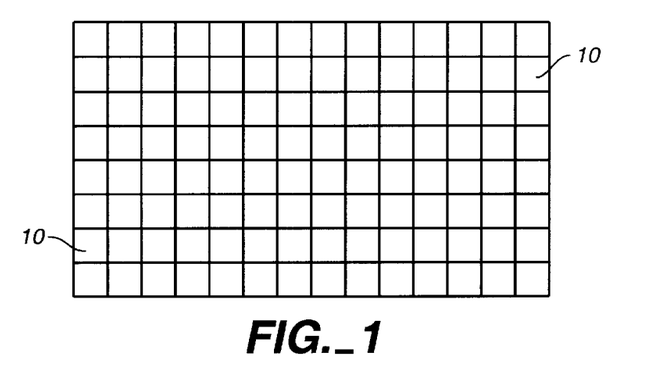
FIG. 1 is a plan view of a metal layer of an IC chip having a plurality of cells.
Figure 2:
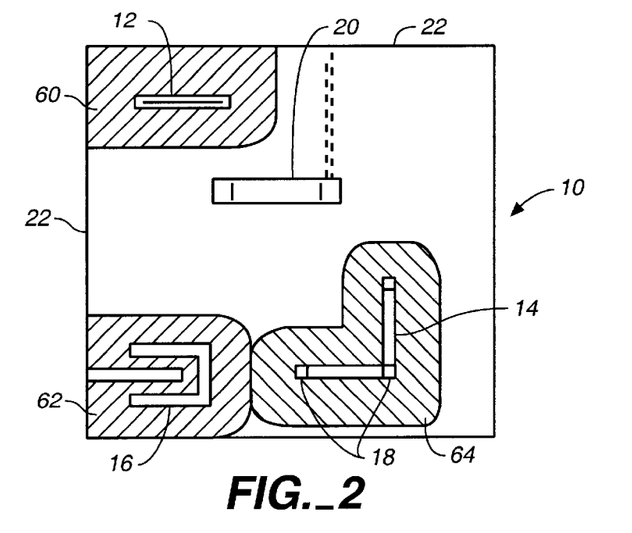
FIG. 2 is a plan view of a metallization layer of a chip illustrating a portion of the process according to the present invention.

FIG. 1 is a plan view of a metal layer of an integrated circuit (IC) chip containing a plurality of cells 10 each having metal conductive features. As shown in FIG. 2, the metal layer portion of each cell includes a plurality of features 12, 14 and 16. The plan view illustrated in FIG. 2 is an x-y plan view illustrating a two-dimensional layout of conductive paths in the cell of the IC chip. Vias 18 may extend in the z-direction to connect a feature, such as conductive feature 14 to other layers of the chip. FIG. 1 also illustrates an additional feature 20 that may or may not have vias 18. The present invention is directed to extending a feature, such as feature 20, to an edge of cell 10 to permit easy connection to the feature and/or allow connection of vias to feature.

Thus, the present invention is directed to determining which of the conductive paths and pins can be coupled to the cell boundary 22 using only the single metal layer, and to attempt to connect as many of the pins and conductive paths to the cell boundaries may be possible. Connections are optimized to maintain a large distance between wires, as well as generation of long continuous segments for possible future vias.

Figure 3:
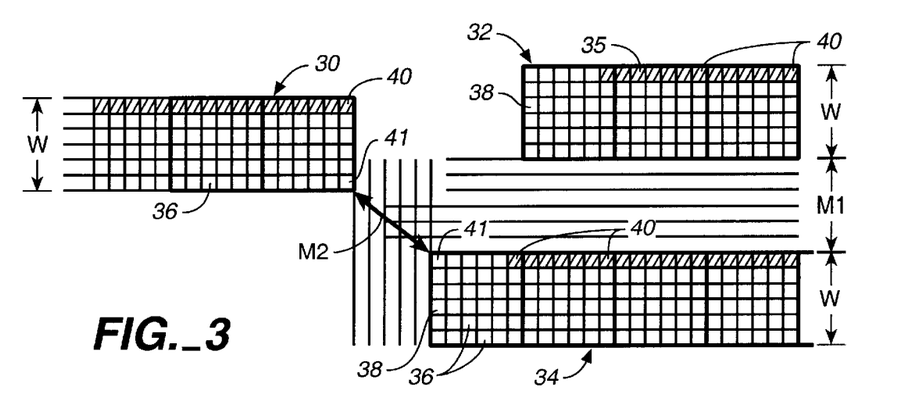
FIG. 3 illustrates an arrangement of conductive wires on an IC chip, and is useful for explaining certain aspects of the present process.

FIG. 3 identifies the physical relationship of wires 30, 32 and 34 on a single metal layer within a cell. The cell is laid out in a discrete x-y coordinate grid, with each grid coordinate representing a grid element 36 of specific dimensions, such as 0.045 by 0.045 microns ($\mu$m). Each wire or conductive path 30, 32 or 34 is constructed by the metallization of plural grid elements 36. In the example shown in FIG. 3, the width, W, of wires 30, 32 and 34 is six grid elements (W=6) to produce wires having a width, W, which is 0.27 $\mu$m. Each conductive wire is laid out by grouping grid elements 36 into overlapping blocks 38 having W by W grid elements. Each block is identified by a single identifying grid element 40 of the block. As shown particularly in FIG. 4, identifying grid elements 40 are identified by X and the grid elements to be metallized, along with the identifying grid elements, are identified by +. Each identifying grid element 40 is located at the upper right-hand corner of each block 38. Thus, the elements 40 are aligned across the top portion of each conductive wire extending in the x-direction and the right side of each conductive wire extending in the y-direction. The grid blocks 38 overlap to extend the lengths and widths of the wires and to form pads and connection points to features of the integrated circuit chip.

As shown in FIG. 3, the minimum horizontal (x-direction) and vertical (y-direction) spacing between two wires is M1 number of grid elements. The minimum diagonal spacing between wires is M2 number of grid element sizes. It is preferred that M1≧M2. In the example to be given, the minimum dimension for each of W and M1 is the width of six grid elements, or 0.27 $\mu$m, and the minimum dimension for M2 is 0.25 $\mu$m (5.55 grid elements). The design rules for connection of blocks 38 are as follows:

1. a wire is a connected set of overlapping blocks 38 with each block shifted from an adjacent block by one grid unit (0.045 $\mu$m) in either or both of the x- and y-directions;
2. if two identifying grid elements 40 are not in the same wire, at least one of the following conditions must be satisfied:
   a) the distance between the x coordinates (Dx) of the two identifying grid elements is at least M1+W−1; or
   b) the distance between the y coordinates (Dy) of the two identifying grid elements is at least M1+W−1; or
   c) the distance along any diagonal between the two wires is at least M2.

The distance between identifying grid elements 40 of different wires is the distance between the closest edges of the grid elements, not a center-to-center distance.

Stated in terms of the identifying grid elements 40, a wire is defined by a contiguous set of identifying grid elements 40 such that for each pair of identifying grid elements A and B in the wire there exists a chain E0, E1 . . . EN of identifying grid elements 40 such that E0=A and EN=B. Each grid element, Ei, has eight neighbors, E(i+1). However, if two identifying grid elements A and B belong to different wires and have x,y coordinates of xA, yA and xB, yB, respectively, then, one of the following conditions must be satisfied $Dx \geq M1+W-1$, or $Dy \geq M1+W-1$, or $[Dx-(W-1)]^2 + [Dy-(W-1)]^2 \geq M2^2$, where Dx=|xA-xB|, and Dy=|yA-yB|.

Using these rules, grid elements that can not be used for routing can be identified and standard filling techniques can be used for analysis as to whether the feature can be connected to the boundary of the cell.

Application of these rules can be explained with reference to FIG. 3. The rules that the distance between the x or y coordinates of the identifying grid elements of the two wires be at least M1+W−1 can be illustrated by wires 32 and 34. It can be observed that the identifying grid elements 40 in wires 32 and 34 are exactly twelve grid elements apart with an identifying grid element being in the top row of the twelve grid elements. Consequently, there are eleven grid elements in the y-direction between the identifying grid elements 40 in wires 30 and 34, meeting the requirement that W and M1 each equal six grid elements.

The rule that the diagonal distance between wires be at least M2 is illustrated by wires 30 and 34 in FIG. 3. The distance M2 is computed along the hypotenuse of the right triangle formed by the nearest corners of grid elements 41 of wires 30 and 34. The x,y coordinates of the nearest grid elements 41 can be related to the x,y coordinates of the identifying grid elements 40 of the corresponding grid block. Thus, with particular reference to wires 30 and 34, the x-coordinate of the center of grid element 41 in wire 30 is offset by six grid elements from the x-coordinate of the center of identifying grid element 40 of the corresponding grid block of wire 32. Consequently, the nearest edges of the two grid elements 41 are five grid elements apart in the x-direction. The center of gird element 41 in wire 30 has the same x-coordinates as the center of identifying grid element 40 of the corresponding grid block 38 of wire 30. However, the x-coordinate of the center of grid element 41 in wire 32 is offset by five grid elements (W−1) from the center of identifying grid element 40 of the corresponding grid block 38. Consequently, the difference (Dx) between the x-coordinates of the two identifying grid elements 40 is ten grid elements, so the relationship that Dx≧M1+W−1 is not true, where M1=6. Similarly, the difference (Dy) between the y-coordinates of the two identifying grid elements 40 is nine grid elements so Dy≧M1+W−1 is not true. M2 is the hypotenuse of the right triangle whose sides are equal to |Dx|−(W−1) and |Dy|−(W−1). In the example of FIG. 3, |Dx|−(W−1) is 5 grid elements and |Dy|−(W−1) is 4 grid elements, so M2 is 6.4 grid elements, which is greater than the minimum number of grid widths for M2 (5.5 grid elements).

The grid elements 36 on the metal layer that cannot be used for routing of a given feature are located by creating a map. The map identifies (a) the unused or free grid elements (herein designated "U"), (b) the grid elements of metal wire for the feature under consideration (herein designated "F"), and (c) the grid elements of metal wires for other features or that are used for blocking metal wires (herein designated "E"). Each layer of the cell (the metal layer under consideration as well as the other layers) is scanned by rows (x-direction) and by columns (y-direction) and each grid element of each scan is categorized with one of U, F and E.

The process is carried out in a computer by first locating the identifying grid elements 40. This is accomplished by changing W−1 elements at an end of each contiguous string of E and F grid elements to U. For example, if W is six grid elements, five grid elements at an end of a string of consecutive Es and Fs are replaced with Us. In one embodiment, the designations are changed at the beginning of the strings so that only the upper-right grid element of each overlapping grid block 38 remains. In alternative embodiments, the designations at the end of the strings may be changed, or designations at both ends may be changed. In any case, W−1 grid element designations of each string are changed to locate identifying grid elements 40.

Figure 5:
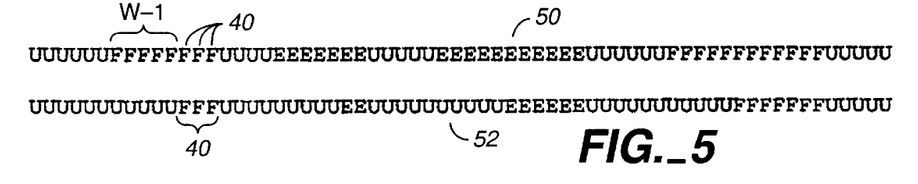
FIG. 5 illustrates part of the process of reduction of metal wires used in the present invention.

FIG. 5 illustrates an example of locating identifying grid elements 40 by changing the designation of W−1 grid elements at the beginning of each string of Es and Fs. The process commences with a column or row 50 of grid elements having the characterizations E, F and U, with the x- or y-coordinates ascending from left to right in the Figure. Where the process is applied to a row, the grid elements have different x coordinates and identical y coordinates. Conversely, the grid elements of a column have identical x coordinates and different y coordinates. Each string of E and F elements has a width (in the rows) or a height (in the columns). In the example of FIG. 5, the strings of the E and F elements is shortened by five [(W−1)=5] to a minimum of one grid element. If all E or F elements of a string are changed, a design violation has occurred (since the minimal width W has not been maintained for the wire) and the process is halted for reevaluation or design modification. Thus, the initial five Es and initial five Fs of each string of Es and Fs of row 50 are changed to Us, as shown in row 52. Resulting row 52 includes the identifying grid elements 40 for the features and defines cell boundaries in the metal layer at grid elements having x,y coordinates of x=W−1, . . . , X−1, and y=W−1, . . . , Y−1.

Figure 6:
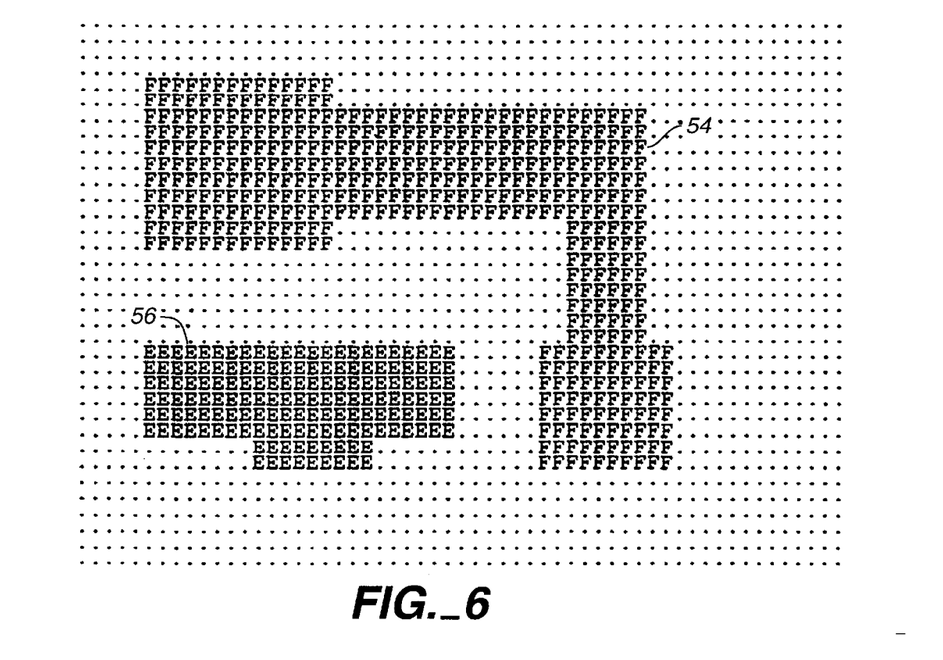
FIGS. 6 and 7 is a plan view of the grid element layout during the metal reduction process described in connection with FIG. 5.
Figure 7:
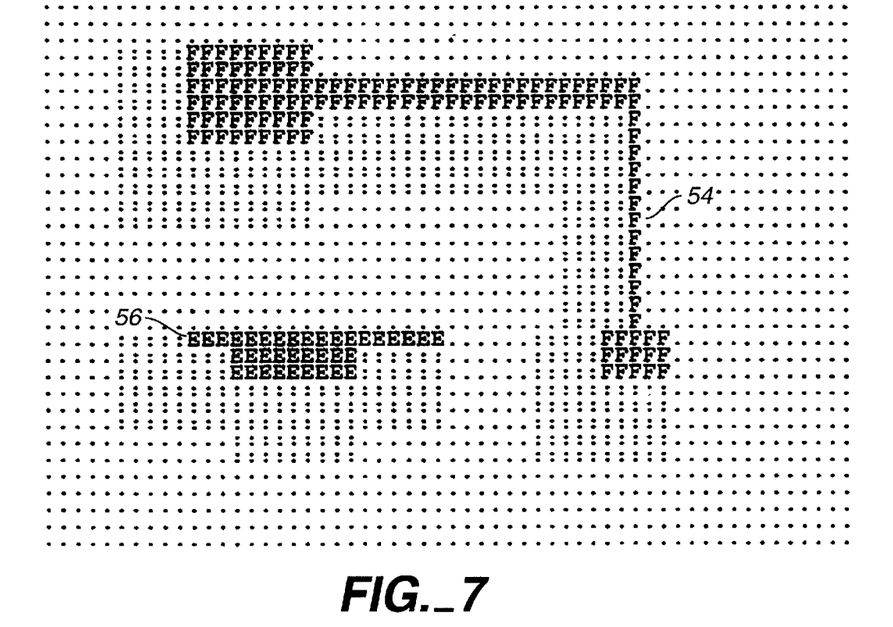

FIG. 6 illustrates patterns 54 and 56 comprising identifying grid elements 40 identified as "E" and "F". FIG. 7 illustrates that same pattern after the step of locating the identifying grid elements 40. In FIG. 7, the grid elements that were changed from "E" or "F" to "U" are designated by a colon (:) to distinguish them from the original U-designated grid elements that are marked with a dot (.). In FIG. 7, the first five (W−1) E- and F-designated grid elements of each row and the bottom five (W−1) E- and F-designated grid elements of each column are changed to Us.

Next, a "shadow" is mapped around each cell feature by identifying grid elements in the metal layer that are neighbors to grid elements 40 designated "E", namely, the grid elements that are portions of a wire for another feature or that block metallization for the feature under consideration. Thus, with reference to FIG. 2, shadows 60, 62 and 64 are created around features 12, 16 and 18 to prevent metallization in those shadow areas when extending wires for feature 20. Neighbors of the grid elements designated "E" are identified by finding each E-designated grid element in the layer, and locating each U-designated grid element that surrounds (to some level of coordinates) the located E-designated grid element. The located U-designated grid element is then tested with rules (a) through (c) above to identify the neighboring status of the grid element. If the grid element meets the one of the rules (is at least M1+W−1 grid elements in either the x- and y-directions, or the distance diagonally between the grid element and all E-designated grid element is at least M2), the grid element remains a U-designated grid element. If, however, the grid element fails all of the tests in relation to any one E-designated grid element, it is re-designated as an N grid element and falls within a shadow illustrated in FIG. 2.

Figure 8:
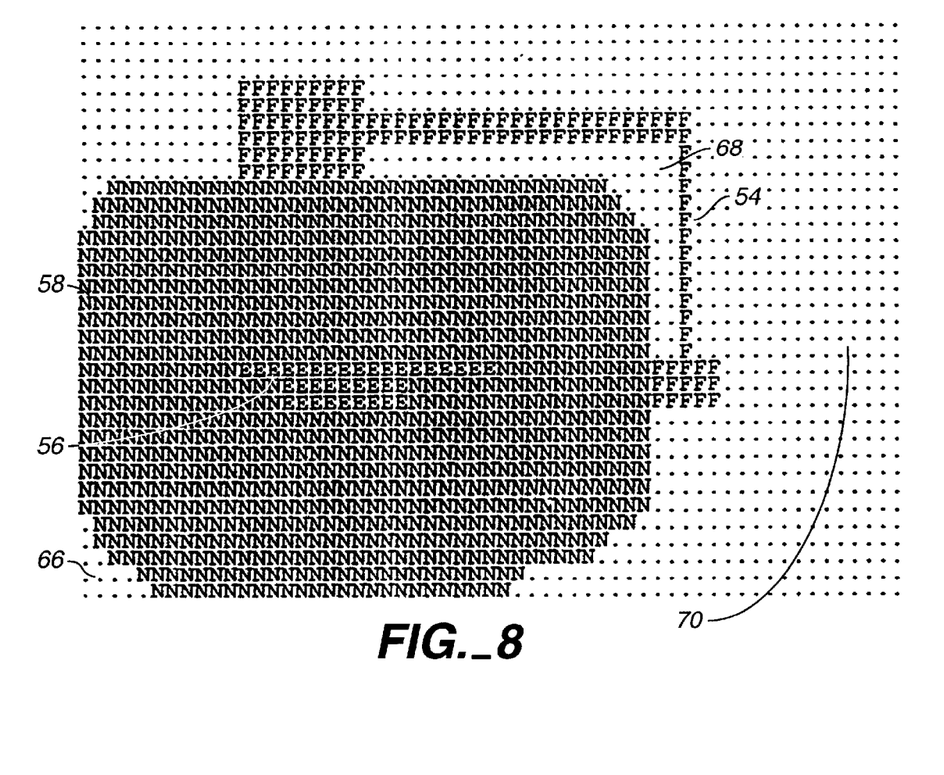
FIG. 8 is a plan view of the grid element layout identifying neighboring grid elements in accordance with the present invention.

FIG. 8 illustrates the re-designation of U-designated grid elements in region 58 surrounding the E-designated grid elements in region 56. Hence, the U-designated grid elements in region 58 are re-designated as N-designated grid elements. As shown in FIG. 8, the U-designated elements in regions 66, 68 and 70 passed at least one test, and therefore remain U-designated grid elements.

One exemplary code for designating neighbor grid elements to E-designated grid elements is, for each z-layer in the cell:

for x=0, 1, . . . X−1 and
for y=0, 1, . . . Y−1,
  if PIX[x] [y] [z] is E
    for xx=0, 1, . . . X−1 and
    for yy=0, 1, . . . Y−1,
      if PIX[xx] [yy] [z] is U
        if (x,y) is "near" (xx,yy)
        then PIX[xx] [yy] [z]=N.

The test of "near" in the last if-statement comprises application of rules (a) through (c) mentioned above.

The next step in the process is to locate and identify as accessible each grid element that can be connected to an F-designated grid element without entering a zone of E- or N-designated grid elements. This is accomplished at each layer in the cell. The goal is to identify, such as by marking with an "A", those U-designated grid elements that lead from the F-designated grid elements to a boundary of the cell.

Figure 9:
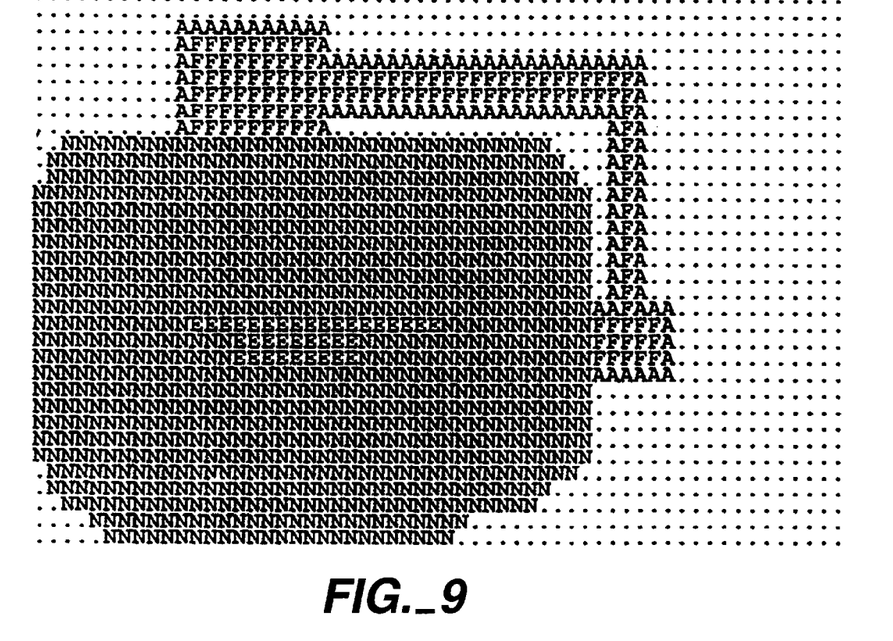
FIGS. 9–11 are plan views of the grid element layout identifying metal wire extensions according to the present invention.
Figure 10:
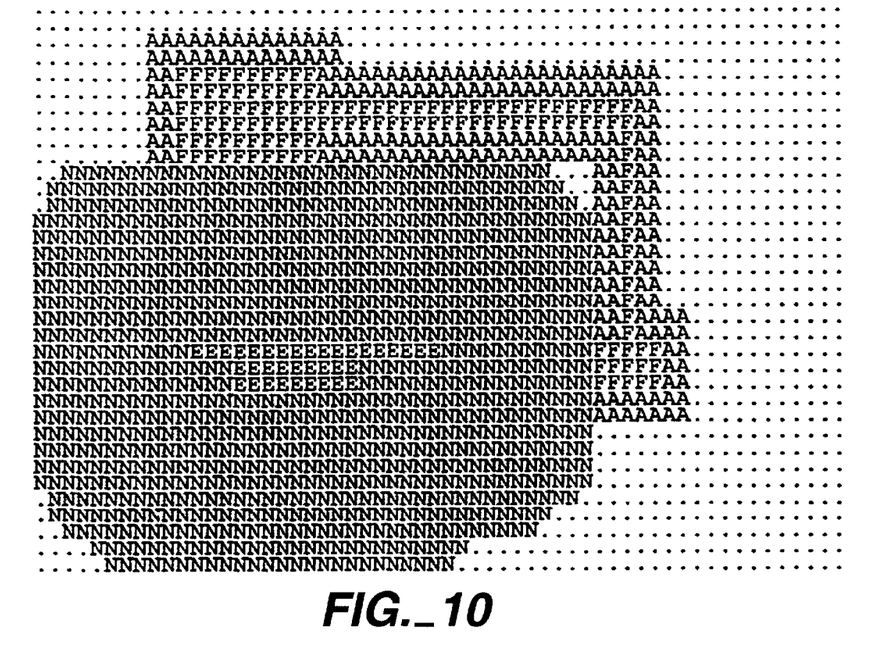
Figure 11:
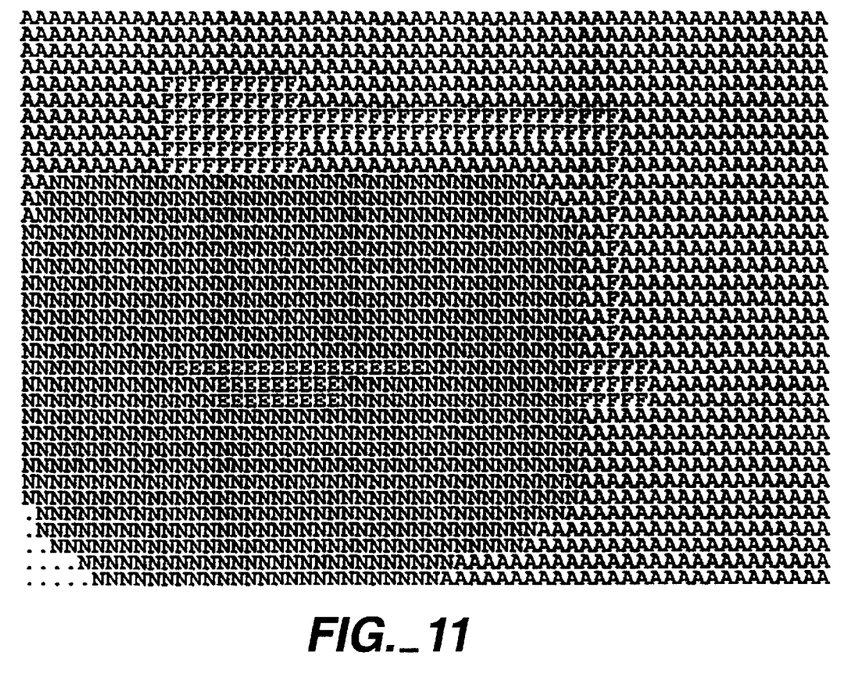

One technique is to arrange the F-designated grid elements into a queue, and, for each grid element in the queue, re-designate all U-designated grid elements that are contiguous to the F-designated grid elements as A-designated elements, as shown in FIG. 9. The process is repeated arranging all F-designated and A-designated grid elements into the queue and re-designating all contiguous U-designated grid elements as A-designated elements, as shown in FIG. 10. The process is repeated until all of the U-designated grid elements accessible to an F-designated grid element are re-designated as A-designated grid elements over the entire plane, as shown in FIG. 11. Noteworthy, the grid elements in region 72 are not re-designated as A-designated grid elements because region 72 is blocked from the F-designated grid elements by E- and N-designated grid element regions 56 and 58 that extend to boundaries 22 of the cell.

One exemplary code for accomplishing re-designation to "A" of the available U-designated grid elements starts with the coordinates of a grid element in the queue and extracts the coordinate pair of the next contiguous grid element.

for Dx=−1, 0, +1,
  if x+Dx is a possible x coordinate inside cell,
    for Dy=−1, 0, +1.
      if y+Dy is a possible y coordinate inside cell,
        if PIX[x+Dx] [y+Dy] [z] is U
        then push (x+Dx,y+Dy) to the queue, and
          set PIX[x+Dx] [y+Dy] [z] to A.

The A-designation to grid elements identifies the accessibility of the feature coupled to the metal wire identified by the F-designations. Thus, if no A-designated grid elements extend from the F-designated grid elements to a boundary 22, the feature is inaccessible. If the feature is accessible, a path to the boundary is defined by identifying the anisotropic distance to the boundary.

The anisotropic distance between each feature and boundary 22 of the cell is computed to identify the minimum distance for connection to the feature. This process is quite similar to the process just described of defining accessible grid elements, except that values are applied to the grid elements based on its distance from the closest F-designated grid element.

In most integrated circuit design and fabrication processes, it is usually less expensive to alter features in the horizontal (x) direction than in the vertical (y) direction. More particularly, it is usually about twice as expensive to alter a feature in the y-direction than in the x-direction. This cost factor is preferably weighted into the values assigned to the A-designated grid elements by assigning values based on |Dx| and 2|Dy|, so that values are doubled in the y-direction. The F-designated grid elements are assigned a value of "0". The E-, N- and remaining U-designated grid elements (at region 66) are assigned an arbitrarily high value, above the range of any nearby A-designated grid elements. The high values assigned to the E-, N- and U-designated grid elements prevents defining the metal path through these regions during subsequent steps in the process; the "0" value assigned to the F-designated grid elements aids subsequent path definition. An exemplary code for computing anisotropic values is:

for Dx=−1, 0, +1,
if x+Dx is a possible x coordinate inside cell,
for Dy=−1, 0, +1,
if y+Dy is a possible y coordinate inside cell,
if
PIX[x+Dx] [y+Dy] [z]≦U, and
PIX[x+Dx] [y+Dy] [z]> PIX[x] [y] [z]+dist(|Dx|, |Dy|)
then push (x+Dx,y+Dy) to the queue, and
set PIX[x+Dx] [y+Dy] [z] to PIX[x] [y] [z]+dist(|Dx|,|Dy|).

The anisotropic distance is the minimum of all values PIX[x] [y] [z] for a given layer z, with x=W−1, . . . , X−1, and y=W−1, . . . , Y−1. Where several connections might be established between the boundary and a feature, the combinations of minimum connections is used for all affected features. Consequently, the connection algorithm includes a while-loop that tentatively identifies a minimum connection of the feature to the boundary of the cell based on the anisotropic distance, and considers the effect of that connection on other features.

Figure 12:
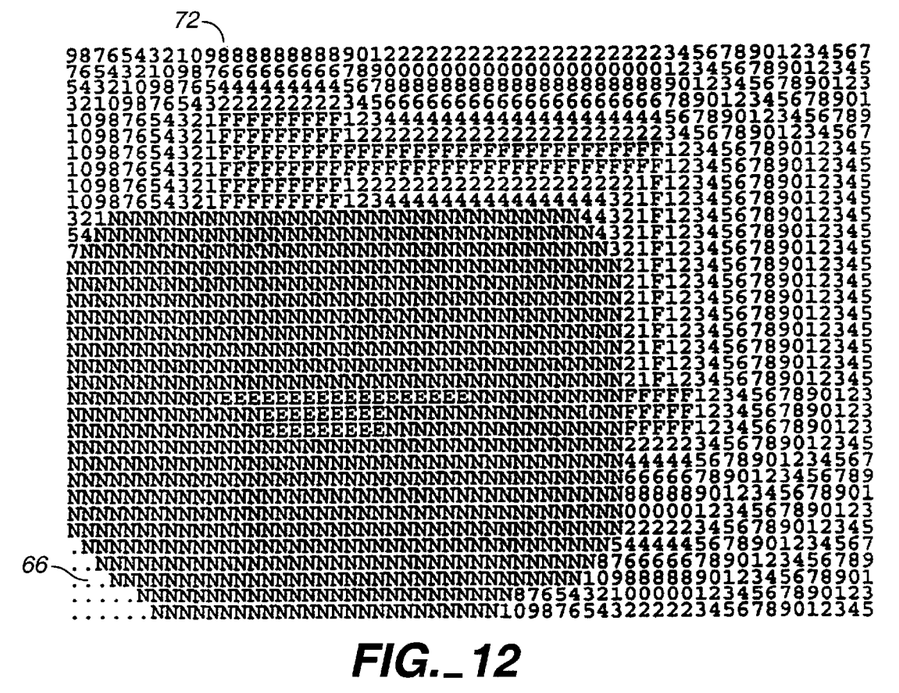
FIGS. 12–14 are plan views of the grid element layout illustrating extension of metal wire according to the present invention.

FIG. 12 illustrates assignment of the values to the A-designated grid elements. FIG. 12 illustrates only the last digit of the values for sake of clarity. Thus, the values assigned to the A-designated grid elements (FIG. 11) increase by 1 for successive A-designated grid elements from the nearest F-designated grid element in the x-direction, and increase by 2 in the y-direction.

An optional optimization algorithm may be employed with the step of computing anisotropic distance. In this case, a default penalty is added to the PIX result of the anisotropic algorithm. Thus, instead of setting PIX[x+Dx] [y+Dy] [z] equal to PIX[x] [y] [z]+dist(|Dx|, |Dy|), PIX[x+Dx] [y+Dy] [z] is set equal to PIX[x] [y] [z]+penalty b(x+Dx, y+Dy) where penalty b is equal to max(C1, C2−|a-a0|−|b-b0|,and where a0,b0 are the coordinates of the grid element having a designation of "E" or "N" that is closest to coordinates a, b, and C1 and C2 are positive constants. Good results occur with C1=1 and C2=W', where W' is a constant based on design rules and cost factors.

Figure 13:
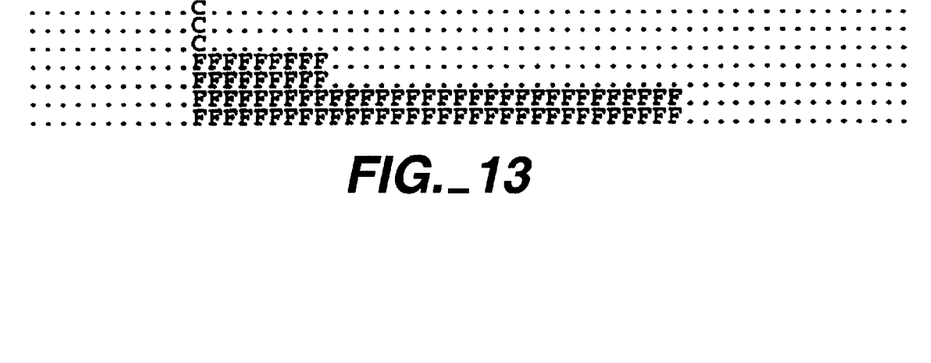

With the anisotropic distance values established, the connection is established between the boundary and the feature. This is accomplished by identifying the boundary grid element(s) 72 having the lowest value, D, where D>0 and tracing back to the lowest valued (0-valued) grid element(s), which are the F-designated grid element(s). As shown in FIG. 12, the lowest valued grid element at a boundary 22 is at the top boundary of the cell and has a value D=4. The contiguous lowest-valued grid point has a value of D=2, and the next contiguous lowest-value grid point is an F-designated grid element having a value of D=0. FIG. 13 illustrates the top six lines of the grid illustrated in FIG. 12. It is preferred that only the left-most grid element having a value "8" (FIG. 12) is designated part of the connection "C" between the boundary and the nearest F-designated grid element, to thereby minimize wire width. If greater connection wire widths are desired, a correspondingly greater number of contiguous low-valued grid elements may be designated "C".

Figure 4:
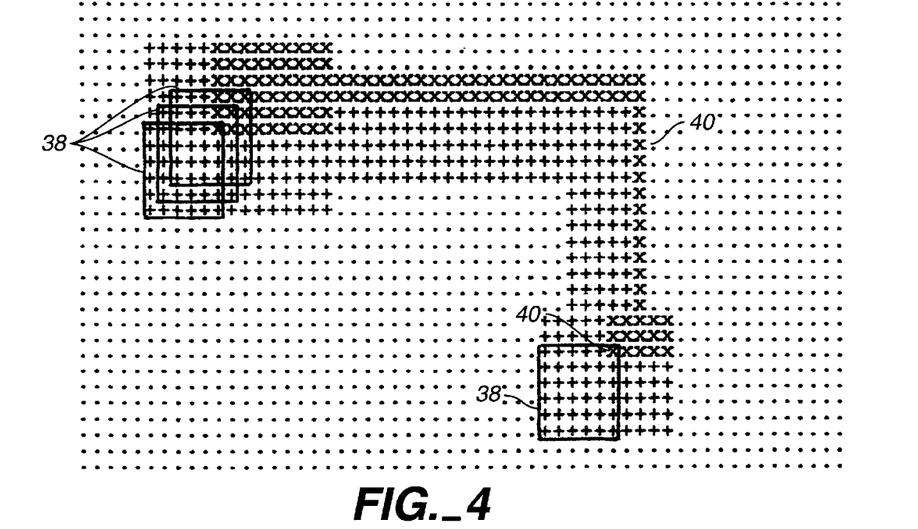
FIG. 4 is a plan view of a layout of grid elements of a wire according to the present invention.
Figure 14:
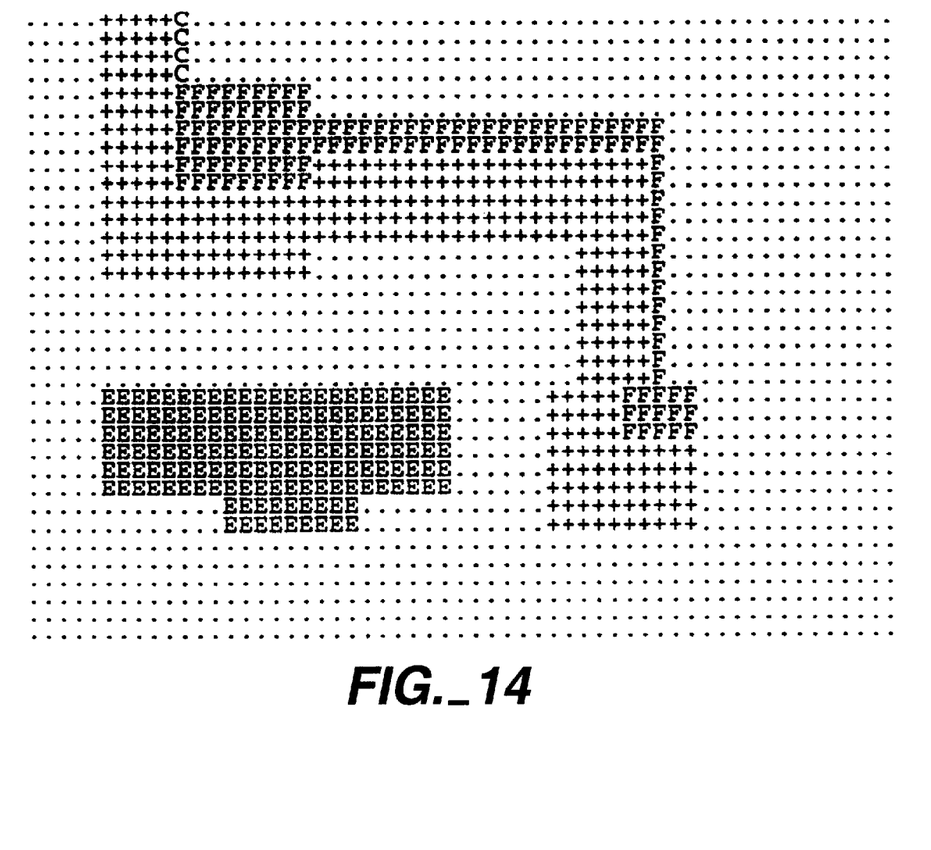

With the x-y coordinates of the grid element at the boundary found with the minimum value, D, wire is added to the metal layer of the cell having a width W. The wire is formed of W by W blocks 38 (FIG. 3) with a starting point at boundary 22, and extending to the metal feature 54. As shown in FIG. 14, the wire is formed using the F- and C-designated grid points as the identifying grid elements 40 for the wire, as illustrated in FIG. 4.

Figure 15:
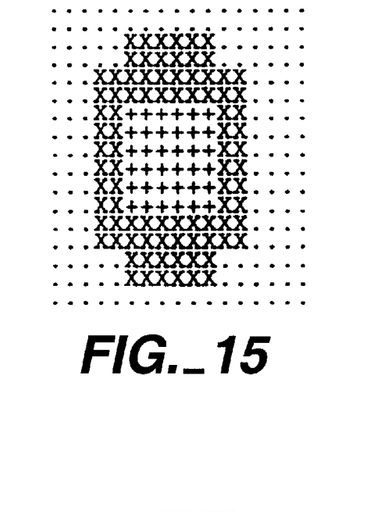
FIGS. 15 and 16 illustrate how vias are formed according to the present invention.
Figure 16:
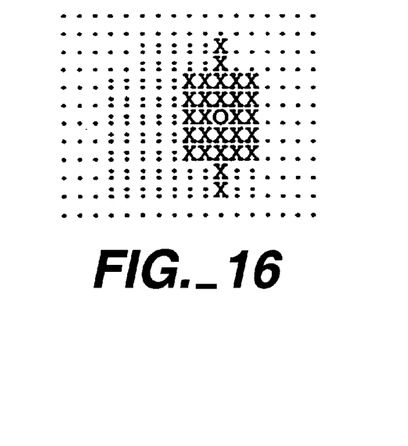

The resulting wire pattern is analyzed for locating positions of possible vias to connect a feature in the metal plane under consideration to a feature in another plane. For purposes of the present invention, a via is centered at the center of a metal grid region that is W' by W' grid elements in size. It will be assumed that design rules require W'=10, so the metal region for a via must be at least 10 by 10 grid elements. It will further be assumed that design rules require that the metallization on each layer of the interlayer channel forming the via is a region of 6 by 6 grid elements, and that at least 2 grid elements surrounding the via in each x- and y-direction on the metal layer under consideration must also be metallized. FIG. 15 illustrates the layout of the via region, together with a fragment of the attached wire, where X represents a metallized grid element and + represents the interlayer channel forming the via. FIG. 16 shows the via region and wire fragment represented by identifying grid elements (as described above) identified as X and O, with "O" being the designation of the grid element that identifies the center of the via, and colons (:) representing the additional grid elements to be metallized, as in FIG. 7.

The via is represented by a square of identifying grid elements, centered on the shifted via position and having side lengths of W'−(W−1). Stated differently, the identifying square has side lengths of W'−W+1. In the example, the side lengths of the identifying square are 10−6+1=5 grid elements in length. The via can be placed on the wire if (1) the identifying square has common or neighboring grid elements with the wire and (2) when added to the wire, the square will not create a violation of rules (a) through (c) described above.

In the case where two vias are to be placed in different wires an additional test is made (to be certain that the squares do not conflict) that treating the squares as having side lengths of 2(W'−W)−1 does not create a violation of rules (a) through (c) above. Another technique is to simply consider shifted via positions for one variable and select the shifted via positions in a given grid row (for x-direction wires) or grid column (for y-direction wires) having the maximum distance to other wires and temporarily mark the (W'−W+1) by (W'−W+1) square of grid elements as a potential shifted via position. The same process is performed on the other variables and non-conflicting vias are selected for metallization. The temporary marking to other via squares are erased or released.

Thus, to find possible vias in the z-direction, there must be at least one F-designated grid element within the identifying square of a potential via, and no grid element of the (W'−W+1) by W'−W+1) square may be a E- or N-designated grid element.

More particularly, a grid element at coordinates x,y is a possible location for the center of a square having W' by W' dimensions identifying a via if 1) in a z-layer, a square region having dimensions (W'−W+1) by (W'−W+1) centered on x,y coordinates contains no E-designated grid elements and at least one F- or C-designated grid element, where W' is the length of a side of the via square, and 2) in all higher z-layers, the corresponding grid elements within a square having the same x,y coordinates are designated "U".

The x,y coordinates of the center of the squares of each layer must be the same, but the square size need not be the same in each layer, depending on design rules.

Figure 17:
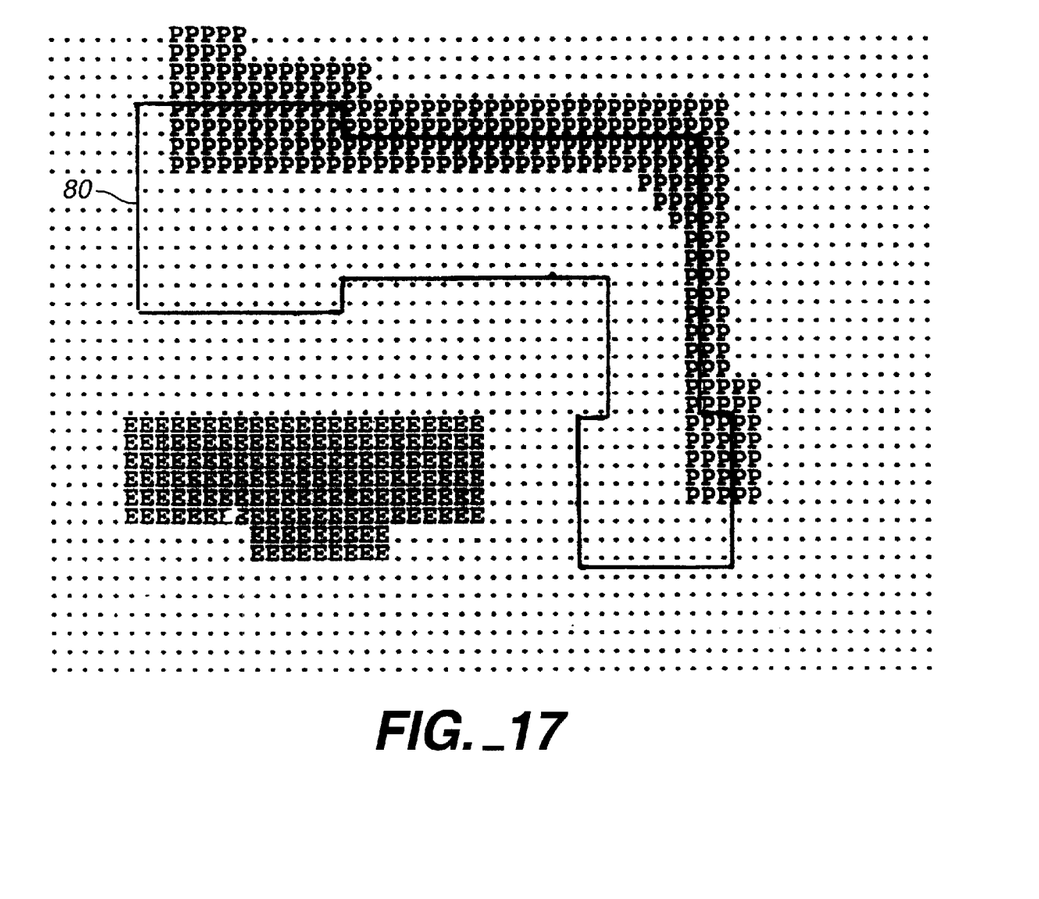
FIG. 17 is a plan view of the grid element layout identifying vias to the metal wire according to the present invention.

FIG. 17 illustrates an example of possible locations (P) for the centers of vias in the layout illustrated in FIG. 14. Each P-designated grid element is a grid element, identifying a possible O-designated grid element (as described in conjunction with FIGS. 15 and 16) for a 10 by 10 grid square defining a via. One of the P-designated grid elements is selected for the center of the via by applying the design rules to each z-layer. The outline of the wire shown in FIG. 14 is illustrated at 80.

The present invention thus provides facilitation of global routing within an IC chip by the addition of wire extensions to library cells. The extensions permit access to cell pins at various points along the extension, thereby improving routing choices, and minimizing congestion and long conductive runs. The codes described herein are exemplary, and those skilled in the art will recognize that other codes and programs may be employed to perform the various routines described herein.

In preferred embodiments the computer program code described herein in part of a computer program embedded or recorded in a computer readable medium, such as a magnetic disk or the like. A computer operates to perform the processes of the invention under the direction of the computer program code. In some embodiments, the computer program code is embedded with network router code on the computer readable medium to permit interaction between a user's computer controlling the process and a computer located at a fabrication facility where the process is actually carried out. One example of a network router can be found in the aforementioned Andreev and Scepanovic applications.

Although the present invention has been described with reference to preferred embodiments, workers skilled in the art will recognize that changes may be made in form and detail without departing from the spirit and scope of the invention.

What is claimed is:

1. A process for extending a metal wire for a feature in an integrated circuit cell, comprising steps of:
    a) defining a grid for a metal layer of the cell, the grid having a plurality of grid elements each having x and y coordinates;
    b) assigning one of a first, second and third designators to each grid element, the first designator being assigned to grid elements representing the metal wire being extended, the second designator being assigned to grid elements representing blockages to extension of the metal wire, and the third designator being assigned to grid elements that represent neither the metal wire being extended nor blockages to the extension of the wire metal;
    c) identifying grid elements having the third designation as grid elements that are neighbors to grid elements having the second designation; and
    d) defining a path through grid elements having the third designation, which are not neighbors to grid elements having the second designation, between a boundary of the cell and grid elements having the first designation.

2. The process of claim 1, wherein step (c) is performed by steps of:
    c1) calculating a difference between x coordinates of a grid element having a third designation and a grid element having a second designation;
    c2) calculating a difference between y coordinates of a grid element having a third designation and a grid element having a second designation;
    c3) calculating a hypotenuse of a right triangle whose sides are based on the differences calculated in steps (c1) and (c2); and
    c4) identifying the grid element having the third designation as a neighbor of the grid element having the second designation if all of the calculations of steps (c1), (c2) and (c3) are smaller than a predetermined amount.

3. The process of claim 1, wherein step (d) is performed by steps of:
    d1) identifying grid elements having the third designation that are not neighbors of a grid element having the second designation that are available for a path between the cell boundary and a grid element having the first designation; and
    d2) identifying a path of minimum length through the available grid elements.

4. The process of claim 3, wherein step (d2) is performed by setting the designation of a grid element having the third designation, which is in a minimum path between the boundary and a grid element having the first designation, to the first designation.

5. The process of claim 1, wherein step (d) further includes steps of:
    d1) identifying grid elements having the third designation that are not neighbors of a grid element having the second designation that are available for a path between the cell boundary and a grid element having the first designation;
    d2) assigning a value to available grid elements based on a distance between the respective available grid element an a grid element having the first designator;
    d3) identifying an available grid element at a boundary based on the values of available grid elements at the boundary;
    d4) defining a path between the identified available grid element and a grid element having the first designator based on the values of available grid elements; and
    d5) metallizing the path.

6. The process of claim 1, further including identifying vias to the grid elements having the first designation on the metal layer through other layers of the cell.

7. The process of claim 1, further including metallizing the path.

8. The process of claim 1, further including, before step (c):
- b1) defining the grid into overlapping blocks of grid elements;
- b2) locating a grid element of each block containing grid elements having only first designators or second designators; and
- b3) performing step (c) for neighbors of the located grid elements having the second designator.

9. The process of claim 8, wherein step (b2) is performed by:
- identifying orthogonal first strings of consecutive grid elements having first designators;
- identifying orthogonal second strings of consecutive grid elements having second designators; and
- changing the designations of a predetermined number of grid elements of each of the first and second strings to the third designation.

10. A process for extending a metal wire for a feature in an integrated circuit cell, comprising steps of:
- a) defining a grid for a metal layer of the cell, the grid having a plurality of grid elements each having x and y coordinates;
- b) assigning a first designator to each grid element representing the metal wire being extended;
- c) assigning a second designator to each grid element representing blockages to extension of the metal wire;
- d) identifying strings of grid elements having first designators and strings of grid elements having second designators in rows and columns of grid elements;
- e) removing the first and second designators from W−1 grid elements of each identified string, where W is a constant based on a minimum design width for wire;
- f) assigning a third designator to each grid element representing a neighbor to a grid element having the second designation;
- g) assigning a fourth designator to each grid element that is not assigned one of the first, second and third designators; and
- h) defining a path, through grid elements having the fourth designation, between a boundary of the cell and grid elements having the first designation.

11. The process of claim 10, wherein step (f) is performed by steps of:
- f1) calculating a difference between x coordinates of a grid element under consideration and a grid element having a second designation;
- f2) calculating a difference between y coordinates of the grid element under consideration and a grid element having a second designation;
- f3) calculating a hypotenuse of a right triangle whose sides are based on the differences calculated in steps (f1) and (f2); and
- f4) assigning the grid element under consideration with the third designation if all of the calculations of steps f1), (f2) and (f3) are smaller than a predetermined amount.

12. The process of claim 10, wherein step (h) is performed by steps of:
- h1) identifying grid elements having the fourth designation that are available for a path between the cell boundary and a grid element having the first designation; and
- h2) identifying a path of minimum length through the available grid elements.

13. The process of claim 10, further including metallizing the path and the feature.

14. The process of claim 13, wherein the step of metallizing the path and the feature includes metallizing the cell at (i) the grid elements defining the path, (ii) grid elements having the first designation and (iii) grid elements that are within W−1 grid elements of the grid elements defining the path and grid elements having the first designation.

15. The process of claim 10, further including identifying vias to the grid elements having the first designation on the metal layer through other layers of the cell.

16. The process of claim 10, wherein step (h) further includes steps of:
- h1) identifying grid elements having the third designation that are not neighbors of a grid element having the second designation that are available for a path between the cell boundary and a grid element having the first designation;
- h2) assigning a value to available grid elements based on a distance between the respective available grid element and a grid element having the first designator;
- h3) identifying an available grid element at a boundary based on the values of available grid elements at the boundary;
- h4) defining a path between the identified available grid element and a grid element having the first designator based on the values of available grid elements; and
- h5) metallizing the path.

17. A computer usable medium having a computer readable program embodied therein for extending a metal wire for a feature in an integrated circuit cell, the computer readable program in the computer usable medium comprising:
- computer readable program code defining a grid for a metal layer of the cell, the grid having a plurality of grid elements each having x and y coordinates;
- computer readable program code which, when executed by a computer, causes the computer to assign a first designator to each grid element representing the metal wire being extended;
- computer readable program code which, when executed by the computer, causes the computer to assign a second designator to each grid element representing blockages to extension of the metal wire;
- computer readable program code which, when executed by the computer, causes the computer to identify strings of grid elements having first designators and strings of grid elements having second designators in rows and columns of grid elements;
- computer readable program code which, when executed by the computer, causes the computer to remove the first and second designators from W−1 grid elements of each identified string, where W is a constant based on a minimum design width for wire;
- computer readable program code which, when executed by the computer, causes the computer to assign a third designator to each grid element representing a neighbor to a grid element having the second designation;
- computer readable program code which, when executed by the computer, causes the computer to assign a fourth designator to each grid element that is not assigned one of the first, second and third designators; and
- computer readable program code which, when executed by the computer, causes the computer to define a path, through grid elements having the fourth designation, between a boundary of the cell and grid elements having the first designation.

18. The computer usable medium of claim 17, wherein the computer readable program code that causes the computer to assign the third designator includes:

computer readable program code which, when executed by the computer, causes the computer to calculate a difference between x coordinates of a grid element under consideration and a grid element having a second designation;

computer readable program code which, when executed by the computer, causes the computer to calculate a difference between y coordinates of the grid element under consideration and a grid element having a second designation;

computer readable program code which, when executed by the computer, causes the computer to calculate a hypotenuse of a right triangle whose sides are based on the differences between the calculated X coordinates and the differences between the calculated Y coordinates; and     computer readable program code which, when executed by the computer, causes the computer to assign the grid element under consideration with the third designation if all of the differences between the calculated X coordinates, the calculated Y coordinates and the calculated hypotenuse are smaller than a predetermined amount.

19. The computer usable medium of claim 17, wherein the computer readable program code that causes the computer to define a path includes:

computer readable program code which, when executed by the computer, causes the computer to identify grid elements having the third designation that are not neighbors of a grid element having the second designation and that are available for a path between the cell boundary and a grid element having the first designation; and     computer readable program code which, when executed by the computer, causes the computer to identify a path of minimum length through the available grid elements.

20. The computer usable medium of claim 17, wherein the computer readable program code that causes the computer to define a path includes:

computer readable program code which, when executed by the computer, causes the computer to metallize the cell at (i) the grid elements defining the path, (ii) grid elements having the first designation and (iii) grid elements that are within W−1 grid elements of the grid elements defining the path and grid elements having the first designation.

\* \* \* \* \*